(12) United States Patent
Abbondanzio et al.

(10) Patent No.: US 10,582,636 B2
(45) Date of Patent: Mar. 3, 2020

(54) SERVER HAVING A DUAL-MODE SERIAL BUS PORT ENABLING SELECTIVE ACCESS TO A BASEBOARD MANAGEMENT CONTROLLER

(71) Applicant: Lenovo Enterprise Solutions (Singapore) Pte. Ltd., Singapore (SG)

(72) Inventors: Antonio Abbondanzio, Raleigh, NC (US); Edward Klodnicki, Durham, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 200 days.

(21) Appl. No.: 15/670,852

(22) Filed: Aug. 7, 2017

(65) Prior Publication Data

US 2019/0045654 A1 Feb. 7, 2019

(51) Int. Cl.
*H05K 7/14* (2006.01)
*G06F 9/02* (2006.01)
(Continued)

(52) U.S. Cl.
CPC ......... *H05K 7/1498* (2013.01); *H05K 7/1494* (2013.01); *G06F 3/1224* (2013.01); *G06F 9/02* (2013.01); *G06F 13/385* (2013.01)

(58) Field of Classification Search
CPC ........ G06F 13/385; G06F 3/1224; G06F 9/02; G06F 13/102; G06F 13/105; G06F 13/14; G06F 13/1657; G06F 13/1663; G06F 15/161; G06F 15/17; G06F 15/173; G06F 15/7807; G06F 15/7825; G06F 15/7835; G06F 15/7871; G06F 3/02; G06F 3/0227; G06F 11/3055; G06F 11/325; G06F 11/328; G06F 11/3006; G06F 2009/45579; G06F 21/85; G06F 13/4022; G06F 11/3027; G06F 11/3048; G06F 11/3051; G06F 11/3089; G06F 11/3093; G06F 13/387; G06F 13/4068; G06F 13/4286; G06F 2213/0002; G06F 2213/0042; G06F 13/122; G06F 13/124; G06F 13/126; G06F 13/128; G06F 13/36; G06F 11/1417; G06F 9/4401;
(Continued)

(56) References Cited

U.S. PATENT DOCUMENTS

7,003,613 B1 * 2/2006 Wang ................... G06F 13/126
710/305
7,624,204 B2 * 11/2009 Furtek ................... G06F 13/385
710/316
(Continued)

*Primary Examiner* — Greg C Bengzon
(74) *Attorney, Agent, or Firm* — Jeffrey L. Streets (57) ABSTRACT

An apparatus includes a computer server having a chipset and a baseboard management controller, wherein the chipset includes a first serial bus controller, and wherein the baseboard management controller includes a second serial bus controller. The apparatus further includes a serial bus port disposed along an external panel of a server enclosure that houses the computer server, wherein the serial bus port is accessible for connection with a connector of a serial communication cable. Still further, the apparatus includes a switch that selectively connects the serial bus port to either the first serial bus controller or the second serial bus controller, wherein the switch is controlled by an output signal from the baseboard management controller.

16 Claims, 4 Drawing Sheets

(51) Int. Cl.
*G06F 13/38* (2006.01)
*G06F 3/12* (2006.01)

(58) Field of Classification Search
CPC .... G06F 9/4406; G06F 13/20; G06F 11/1469;
G06F 11/1666; G06F 12/0246; G06F
2201/805; G06F 2201/84; G06F 2201/85;
G06F 2212/7201; G06F 8/654; G06F
11/0793; G06F 9/4411; G06F 11/0727;
G06F 11/3058; G06F 8/65; H05K 7/1498;
H04L 41/0813; H04L 61/2038; H04L
41/044; H04L 41/0803; H04L 41/28;
H04L 61/2015; H04L 61/2514; H04L
61/2521; H04L 41/0618; H04L 41/0672;
H04B 1/44; H04W 4/80; H04W 4/10;
H04W 76/30; H04W 76/45; H04W 92/02;
H04W 76/10; H04W 48/02; H04W 48/16;
H04W 48/17; H04W 48/20; H04W
88/005; H04W 76/25; H04M 1/72519;
H04M 2250/12; H04M 2250/22
See application file for complete search history.

(56) References Cited

U.S. PATENT DOCUMENTS

| | | | | |
|---|---|---|---|---|
| 8,650,328 B1* | 2/2014 | Chatterjee | | G06F 11/2097 710/4 |
| 8,898,349 B1* | 11/2014 | Mondal | | G06F 13/385 710/15 |
| 8,943,373 B1* | 1/2015 | Angaluri | | G06F 11/162 710/15 |
| 9,183,168 B2* | 11/2015 | Adrian | | G06F 13/385 |
| 9,355,055 B1* | 5/2016 | Klein | | G06F 13/4022 |
| 9,672,179 B2* | 6/2017 | Chang | | G06F 3/1423 |
| 9,785,771 B1* | 10/2017 | Pratt | | G06F 21/554 |
| 2005/0066017 A1* | 3/2005 | Bogia | | G06F 11/2023 709/220 |
| 2005/0235082 A1* | 10/2005 | Sato | | G06F 3/0619 710/74 |
| 2005/0283549 A1* | 12/2005 | Gibson | | G06F 13/385 710/62 |
| 2006/0068760 A1* | 3/2006 | Hameed | | H04L 63/061 455/412.1 |
| 2006/0167886 A1* | 7/2006 | Kantesaria | | G06F 9/4405 |
| 2006/0212762 A1* | 9/2006 | Zimmer | | G06F 11/0712 714/6.13 |
| 2007/0132733 A1* | 6/2007 | Ram | | G06F 3/0227 345/163 |
| 2007/0168574 A1* | 7/2007 | Martinez | | G06F 21/55 710/15 |
| 2008/0005222 A1* | 1/2008 | Lambert | | G06F 3/0227 709/203 |
| 2008/0005262 A1* | 1/2008 | Wurzburg | | G06F 13/4022 709/217 |
| 2008/0005446 A1* | 1/2008 | Frantz | | G06F 13/107 710/313 |
| 2008/0037050 A1* | 2/2008 | Sasaki | | G06F 13/102 358/1.13 |
| 2008/0062976 A1* | 3/2008 | Mittapalli | | H04L 41/04 370/389 |
| 2008/0109566 A1* | 5/2008 | Hitt | | G06F 13/385 710/10 |
| 2009/0100194 A1* | 4/2009 | Bhadri | | G06F 13/105 709/244 |
| 2009/0153340 A1* | 6/2009 | Pinder | | H04B 1/44 340/665 |
| 2009/0193242 A1* | 7/2009 | Huang | | G06F 11/1417 713/2 |
| 2009/0199031 A1* | 8/2009 | Zhang | | G06F 1/3203 713/323 |
| 2010/0030929 A1* | 2/2010 | Ben-Yacov | | G06F 13/385 710/33 |
| 2010/0060571 A1* | 3/2010 | Chen | | G06F 3/0227 345/157 |
| 2010/0076616 A1* | 3/2010 | Kagan | | G01R 19/2513 700/295 |
| 2010/0082874 A1* | 4/2010 | Baba | | G06F 13/387 710/316 |
| 2010/0122010 A1* | 5/2010 | Yan | | G06F 13/4022 710/316 |
| 2010/0211767 A1* | 8/2010 | Chu | | G06F 11/1417 713/2 |
| 2011/0202983 A1* | 8/2011 | Pope | | G06F 21/572 726/7 |
| 2012/0158890 A1* | 6/2012 | Jreij | | G06F 11/0784 709/217 |
| 2012/0233365 A1* | 9/2012 | Baek | | G06F 13/4282 710/72 |
| 2013/0010787 A1* | 1/2013 | Chou | | H05K 7/1498 370/389 |
| 2013/0067534 A1* | 3/2013 | Soffer | | G06F 3/0227 726/2 |
| 2013/0132758 A1* | 5/2013 | Shiba | | G06F 1/28 713/340 |
| 2013/0138933 A1* | 5/2013 | Wang | | G06F 13/4022 713/1 |
| 2013/0138940 A1* | 5/2013 | Wang | | G06F 8/654 713/2 |
| 2013/0151841 A1* | 6/2013 | McGraw | | G06F 11/3006 713/100 |
| 2013/0179599 A1* | 7/2013 | Ichieda | | G06F 3/0383 710/8 |
| 2013/0339938 A1* | 12/2013 | He | | G06F 8/65 717/168 |
| 2014/0126138 A1* | 5/2014 | Zhang | | G06F 1/185 361/679.32 |
| 2014/0143527 A1* | 5/2014 | Boyd | | G06F 13/409 713/1 |
| 2014/0149658 A1* | 5/2014 | Boyd | | G06F 3/0607 711/112 |
| 2014/0173093 A1* | 6/2014 | Rabeela | | H04L 61/2038 709/224 |
| 2014/0208134 A1* | 7/2014 | Waters | | G06F 13/385 713/310 |
| 2014/0244869 A1* | 8/2014 | Adrian | | G06F 13/385 710/106 |
| 2014/0298091 A1* | 10/2014 | Carlen | | H04L 65/80 714/15 |
| 2014/0337558 A1* | 11/2014 | Powers | | G06F 13/4072 710/313 |
| 2014/0344595 A1* | 11/2014 | Jenne | | G06F 1/32 713/320 |
| 2015/0039788 A1* | 2/2015 | Dearing | | G06F 13/385 710/18 |
| 2015/0052389 A1* | 2/2015 | Swanson | | G06F 11/2023 714/11 |
| 2015/0058542 A1* | 2/2015 | Chao | | H05K 7/1498 711/103 |
| 2015/0067209 A1* | 3/2015 | Liu | | H03K 5/22 710/106 |
| 2015/0067388 A1* | 3/2015 | Xiao | | G06F 11/1415 714/6.12 |
| 2015/0106660 A1* | 4/2015 | Chumbalkar | | G06F 11/0727 714/42 |
| 2015/0172112 A1* | 6/2015 | Itkin | | H04L 45/245 370/216 |
| 2015/0186150 A1* | 7/2015 | Chung | | G06F 9/4408 711/103 |
| 2015/0186319 A1* | 7/2015 | Blevins | | G06F 13/4068 710/301 |
| 2015/0215343 A1* | 7/2015 | Itkin | | H04L 41/04 709/217 |
| 2015/0220139 A1* | 8/2015 | Puthillathe | | G06F 1/3293 713/323 |
| 2015/0234763 A1* | 8/2015 | Kline | | G06F 13/4022 710/313 |
| 2015/0234764 A1* | 8/2015 | Kline | | G06F 13/4022 710/5 |

(56) References Cited

U.S. PATENT DOCUMENTS

| | | | |
|---|---|---|---|
| 2015/0234765 A1* | 8/2015 | Kline | G06F 13/4022 710/316 |
| 2015/0271010 A1* | 9/2015 | Shetty | H04L 41/0803 709/220 |
| 2015/0277856 A1* | 10/2015 | Payne | G06F 7/588 708/255 |
| 2015/0277930 A1* | 10/2015 | Sarangdhar | G06F 21/575 713/2 |
| 2015/0309954 A1* | 10/2015 | Moore | G06F 13/426 710/316 |
| 2015/0347287 A1* | 12/2015 | Tripathi | G06F 1/3287 711/154 |
| 2016/0072642 A1* | 3/2016 | Shih | H04L 12/4666 370/392 |
| 2016/0094359 A1* | 3/2016 | Bidaralli | H04L 12/1895 709/224 |
| 2016/0117274 A1* | 4/2016 | Waters | G06F 13/362 710/106 |
| 2016/0127171 A1* | 5/2016 | Kutch | H04L 67/10 709/223 |
| 2016/0179072 A1* | 6/2016 | Nishi | G05B 19/0425 700/83 |
| 2016/0187420 A1* | 6/2016 | Trethewey | G06F 11/3656 714/727 |
| 2016/0203343 A1* | 7/2016 | Soffer | G06F 13/102 726/34 |
| 2016/0234960 A1* | 8/2016 | Masuyama | H05K 7/1498 |
| 2016/0274941 A1* | 9/2016 | Krithivas | G06F 9/5072 |
| 2016/0275037 A1* | 9/2016 | Dube | G06F 13/4282 |
| 2016/0328300 A1* | 11/2016 | Rahardjo | G06F 11/1417 |
| 2016/0335222 A1* | 11/2016 | Schnell | G06F 13/385 |
| 2016/0378704 A1* | 12/2016 | Adamson | G06F 13/364 710/104 |
| 2017/0004098 A1* | 1/2017 | Das Sharma | G06F 13/385 |
| 2017/0010659 A1* | 1/2017 | Park | G06F 1/26 |
| 2017/0109248 A1* | 4/2017 | Yang | G06F 11/3027 |
| 2017/0111215 A1* | 4/2017 | Chou | H04L 41/0618 |
| 2017/0132168 A1* | 5/2017 | Ahmed | G06F 13/4068 |
| 2017/0134217 A1* | 5/2017 | Ahmed | H04L 41/044 |
| 2017/0134223 A1* | 5/2017 | Ahmed | H04L 63/08 |
| 2017/0139467 A1* | 5/2017 | Waters | G06F 1/3287 |
| 2017/0140739 A1* | 5/2017 | Butcher | G09G 5/39 |
| 2017/0147522 A1* | 5/2017 | Yu | G06F 13/4022 |
| 2017/0201419 A1* | 7/2017 | Garcia | H04L 41/0896 |
| 2017/0300371 A1* | 10/2017 | Soffer | G06F 11/0709 |
| 2017/0310790 A1* | 10/2017 | Vajravel | H04L 67/141 |
| 2017/0344508 A1* | 11/2017 | Setiawan | G06F 13/4282 |
| 2017/0359124 A1* | 12/2017 | Mattos | H04B 10/27 |
| 2018/0039797 A1* | 2/2018 | Lambert | G06F 13/4282 |
| 2018/0224912 A1* | 8/2018 | Wang | G06F 13/38 |
| 2018/0239718 A1* | 8/2018 | Jabori | G06F 13/4295 |

\* cited by examiner

SERVER HAVING A DUAL-MODE SERIAL BUS PORT ENABLING SELECTIVE ACCESS TO A BASEBOARD MANAGEMENT CONTROLLER

BACKGROUND

The present disclosure relates to server architecture that enables selective access to a baseboard management controller.

BACKGROUND OF THE RELATED ART

In a systems management environment, management of datacenter hardware by a management computer is a common and repetitive task. In order to manage the datacenter hardware, such as a large number of servers, the user may use a laptop or other remote console to access the interface to the management computer. For example, a datacenter may have a substantial number of servers, where each server has a baseboard management controller (BMC) that can communicate with the management computer over a network. From the centralized management interface, the user can manage each of the servers.

BRIEF SUMMARY

One embodiment provides an apparatus comprising a computer server including a chipset and a baseboard management controller, wherein the chipset includes a first serial bus controller, and wherein the baseboard management controller includes a second serial bus controller. The apparatus further comprises a serial bus port disposed along an external panel of a server enclosure that houses the computer server, wherein the serial bus port is accessible for connection with a connector of a serial communication cable. Still further, the apparatus comprises a switch that selectively connects the serial bus port to either the first serial bus controller or the second serial bus controller, wherein the switch is controlled by an output signal from the baseboard management controller.

DETAILED DESCRIPTION

One embodiment provides an apparatus comprising a computer server including a chipset and a baseboard management controller, wherein the chipset includes a first serial bus controller, and wherein the baseboard management controller includes a second serial bus controller. The apparatus further comprises a serial bus port disposed along an external panel of a server enclosure that houses the computer server, wherein the serial bus port is accessible for connection with a connector of a serial communication cable. Still further, the apparatus comprises a switch that selectively connects the serial bus port to either the first serial bus controller or the second serial bus controller, wherein the switch is controlled by an output signal from the baseboard management controller.

A computer server is a hardware device that provides functionality or services to one or more client devices. The architecture of a server may vary, but will typically include at least one processor, memory, and a network adapter. A server may also include a baseboard management controller (BMC) that provides the server with out-of-band management and monitoring capabilities. The use of the term "baseboard management controller" is used broadly and is intended to include any service processor, such as a "unified extensible firmware interface", that performs the function of the baseboard management controller 23 even if it may also perform other functions.

A chipset is an integrated circuit that that manages the data flow between the processor, memory and peripherals. The architecture of the chipset may be specialized to work with a particular company's line of servers or a particular processor design. For example, one such chipset may include a platform controller hub (PCH), where the first serial bus controller is included in the platform controller hub.

Serial communication sends data one bit at a time between two devices. There are numerous serial communication protocols and architectures that may be used, such as those of the Universal Serial Bus (USB) industry standard. For example, the serial bus port may be a Universal Serial Bus port, the first serial bus controller may be a first Universal Serial Bus controller, and the second serial bus controller may be a second Universal Serial Bus controller. However, other serial communication standards could be similarly implemented.

Another embodiment of the apparatus may further comprise a button disposed along the external panel of the server enclosure. The button supports a user who is physically present near the server, such as in front of the server, and wants to switch the serial bus port back and forth between the BMC and the server chipset when the server is powered on. The button is preferably in communication with an input to the baseboard management controller, wherein the baseboard management controller toggles the switch between a connection with the first serial bus controller and the second serial bus controller in response to receiving a signal from the button while the server is power on. In one option, the baseboard management controller has a first general purpose input output pin for receiving input from the button and a second general purpose input output pin for sending the output signal to the switch. Accordingly, the baseboard management controller may process program instructions to toggle the switch in response to receiving the input from the button indicating that a user has pressed or otherwise activated the button. Similarly, the baseboard management controller may also toggle the switch in response to the baseboard management controller receiving a switch toggle command from a user interface while the server is powered on. Optionally, the external panel may also include an LED that indicates to a user whether the external panel serial bus port is presently connected to the BMC or to the server.

The baseboard management controller will preferably control the switch to connect the serial bus port to the second serial bus controller in response to the computer server being powered off. Since the server is powered off, the chipset is unable to utilize the external panel serial bus port. Conversely, the baseboard management controller will preferably also control the switch to connect the serial bus port to the first serial bus controller in response to detecting that power to the computer server has been initiated and that no mobile computing device is presently communicating with the baseboard management controller through the serial bus port. In other words, the chipset gets priority over a connection with the external panel serial bus port unless the external panel serial bus port is currently being used for communication with the baseboard management controller. However, the baseboard management controller may control the switch to connect the serial bus port to the first serial bus controller in response to detecting an end to a communication session with a mobile computing device through the serial bus port. The end to a communication session may be determinable or detectable by a period of inactivity of the second serial bus controller exceeding a predetermined duration. In response to the switch connecting the serial bus port to the first serial bus controller, the baseboard management controller will preferably output a message to the management computer indicating that connecting the serial bus port to the second serial bus controller (i.e., disconnecting the serial bus port from the first serial bus controller) may disrupt ongoing operations. It is then the user's responsibility to determine whether there are any ongoing operations with the chipset via the external panel serial bus port before taking any action that would toggle the switch to disconnect the chipset from the external panel serial bus port.

Embodiments of the baseboard management controller may further include an Ethernet controller for communicating with a management computer over a management network. The Ethernet controller may be used to send service data to the management computer and to receiving commands and update files. Embodiments of the baseboard management controller may also include a serial bus port for direct communication with the first serial bus controller, which is part of the chipset. This channel allows the baseboard management controller to monitor and manage various aspects of the server's in-band operations.

Using the switch to make a connection from the serial bus port to the second serial bus controller enables a mobile computing device to communicate with the baseboard management controller via a serial communication cable coupled between the mobile computing device and the serial bus port. For example, the second serial bus controller may communicate with the mobile computing device using an Ethernet over Universal Serial Bus protocol. In various embodiments, the baseboard management controller may provide service data to the mobile computing device and may receive one or more server management instruction, setting, and/or data from the mobile computing device, such as out-of-the-box provisioning of configuration settings, BMC recovery operations, and firmware updates. Optionally, the connection to the BMC may be used to provide a virtual operator panel feature via an application running on the mobile computing device. The application may provide a user interface that allows a user to configure how the serial bus port is used by the baseboard management controller.

Embodiments may include computer program products comprising non-transitory computer readable storage media having program instructions embodied therewith, wherein the program instructions are executable by a processor to implement or initiate any one or more aspects of the actions or methods described herein. Accordingly, a separate description of the methods will not be duplicated in the context of a computer program product. It should be recognized that any computer program product may be distributed among the mobile computing device, a selected server, and the management computer, such that each entity performs its own contribution to the disclosed methods.

Figure 1:
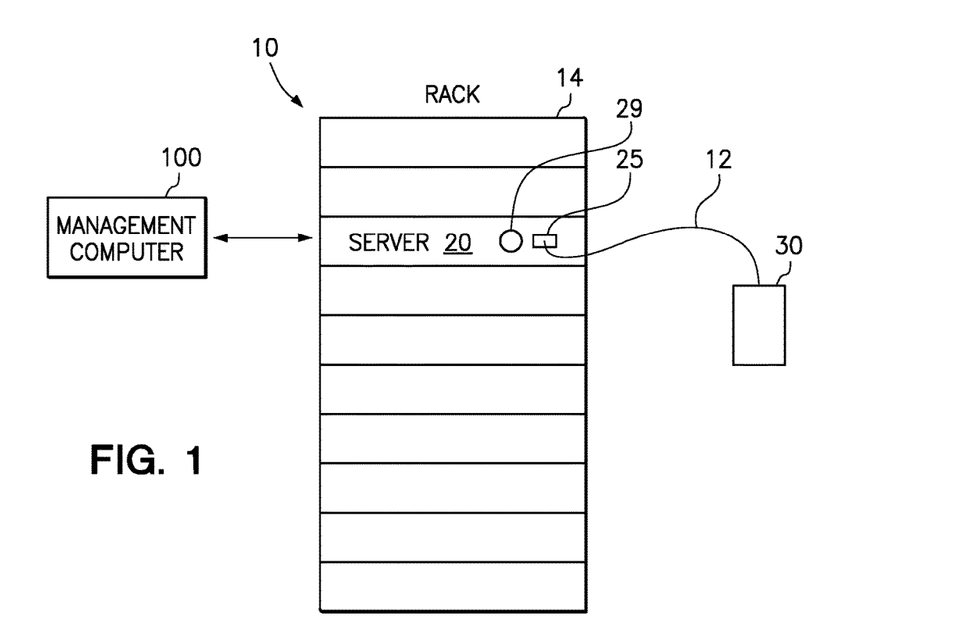
FIG. 1 is a diagram of a system including a server that is managed by a management computer and has a serial bus port on the external panel of the server for being connected to a cable from a mobile computing device.

FIG. 1 is a diagram of a system 10 including a server 20 that is managed by a management computer 100 and has a USB port 25 on the external panel of the server for being connected to a cable 12 from a mobile computing device 30. The server 20 may be among any number of servers stored in one or more racks 14. For example, a datacenter may have a large number of racks 14, with each rack supporting multiple servers like the server 20. An individual user, such as a system administrator, may select any one of the servers 20 in any one of the racks 14 and then communicate with, and manage, the selected server 20 using the mobile computing device 30 by first connecting the cable 12 between the mobile computing device 30 and the USB port 25 on the external panel of the selected server. The individual user may also communicate with, and manage, the selected server 20 by directly interacting with the management computer 100, which may be located remotely from the server 20. As shown, the external panel of the server 20 also includes a button 29 that can be manually operated by the individual user to toggle a switch that controls whether the USB port 25 is connected to a chipset of the server 20 or a baseboard management controller of the server 20. The operation of the button 29 and control of the switch is described further in reference to FIG. 2.

Figure 2:
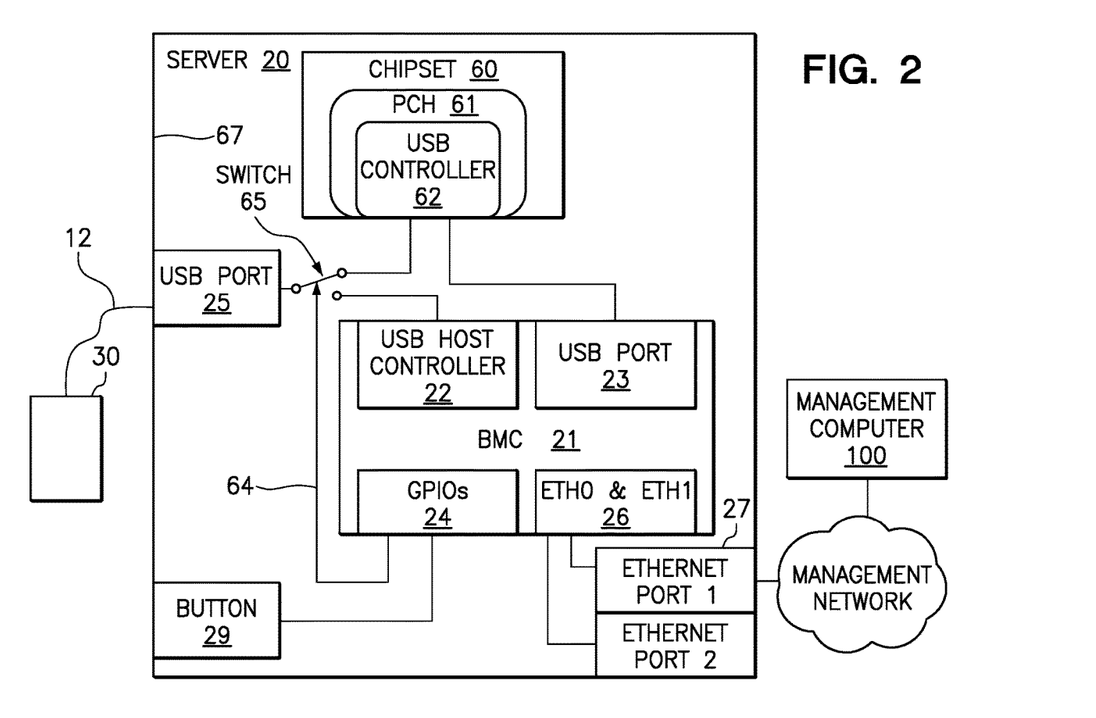
FIG. 2 is a diagram of a server according to one embodiment.

FIG. 2 is a diagram of a server 20 according to one embodiment. Many of the details of a server are omitted, but an example of suitable architecture for the omitted portions of the server may be found by reference to the computer 100 shown in FIG. 3. The server 20 includes a chipset 60 that manages data flow among a processor, memory and peripherals of the server. In the embodiment shown, the chipset 60 has a platform controller hub (PCH) 61 that includes a USB controller 62.

The server 20 also includes a baseboard management controller 21, which is a service processor that monitors and manages various aspects of the server 20. The use of the term "baseboard management controller" is used broadly and is intended to include any service processor, such as a "unified extensible firmware interface", that performs the function of the baseboard management controller 21 even if it may also perform other functions. The baseboard management controller 21 includes a USB controller 22, a USB port 23, general purpose input output (GPIO) pins 24, and management network input/output adapter 26, such as an Ethernet adapter.

The USB controller 22 of the BMC 21 and the USB controller 62 of the chipset 60 are both connected to a switch 65 that is also connected to the USB port 25. The switch 65 is controlled by a signal on a line 64 output from one of the GPIO pins 24 of the BMC 21. The BMC may control the switch 65 to toggle between a first position that connects the USB controller 62 of the chipset 60 to the USB port 25 and a second position that connects the USB controller 22 of the BMC 21 to the USB port 25.

As shown, the serial bus port 25 is disposed along an external panel 67 of the server 20 and is open in the forward direction such that a connector on the serial communication cable 12 may be plugged into the serial bus port 25 from adjacent the server, such as the front of the server. An individual user may interact with either the server chipset 60 or the baseboard management controller 21 by connecting the mobile computing device 30 to the serial bus port 25 via the cable 12 and causing the switch 65 to form a connection with the desired device. The external panel 67 of the server 20 may also include a button 29, which may be used to toggle the switch 65.

The USB port 23 of the BMC 21 is connected to the USB controller 62 of the chipset 60 for communication there between. This connection allows the BMC 21 to monitor and manage operation of the chipset 60.

The management network input/output adapter 26 is connected to a management network port 27 that is, in turn, connected to the management computer 100 via a management network. Accordingly, the management computer 100 may communicate with the BMC 21 to monitor and manage operation of the server 20. The adapter 26, port 27 and management network may use an Ethernet standard.

It is expected that the USB port 25 will be used with the server chipset 60 the majority of the time rather than with the BMC 21. Therefore, the BMC 21 may control the switch so that the default connection of the external panel USB port 25 will be to the PCH USB controller 62. However, the external panel USB port may be automatically connected to the BMC when the server is powered off since the server will not be running at that time. When the BMC detects that server power is off, the BMC may automatically connect the external panel USB port to the BMC's USB controller so that the USB port can be used with the BMC. The BMC will preferably maintain its connection to the external panel USB port while the server is powered off regardless of whether or not the BMC is involved in any communication via the USB port. When the server is powered on, the BMC may connect the external panel USB port back to the chipset USB controller unless an application running on the mobile computing device 30 is currently communicating with the BMC. When the mobile app session ends or times out, the BMC may switch the USB port back to the chipset USB controller.

When the USB cable 12 is connected between the mobile computing device 30 and the server's external panel USB port 25, the BMC 21 loads the appropriate USB drivers and establishes an Ethernet over USB connection between the mobile app running on the mobile computing device 30 and the BMC 21. The Ethernet over USB connection between the BMC 21 and the mobile computing device 30 via the external panel USB port 25 is a separate connection than the internal Ethernet over USB connection between the BMC 21 and the server chipset 60. Furthermore, it is possible for the BMC to have three (3) concurrent network connections when the mobile computing device is connected to the external panel USB port. Those three connections include the connection to the external management network, the internal Ethernet over USB connection to the server chipset, and the external panel Ethernet over USB connection to the mobile computing device.

As shown, the Ethernet over USB functionality that is implemented for the external USB port is similar but not identical to the function provided by the BMC for the internal Ethernet over USB connection to the server. Specifically, for the internal Ethernet over USB connection from the BMC to the server, the server's PCH is the USB host and the BMC is the USB device. Therefore, the device (BMC) provides the MAC address and IP address assignments for both the BMC and the server. However, for the external panel Ethernet over USB connection from the BMC to the mobile computing device, the BMC is the USB host and the mobile computing device is the USB device. Accordingly, the mobile computing device provides the MAC address and IP address assignments for both the BMC and itself. Once a network connection is established between the mobile device and the BMC, any of the supported network protocols can be used for communication.

Figure 3:
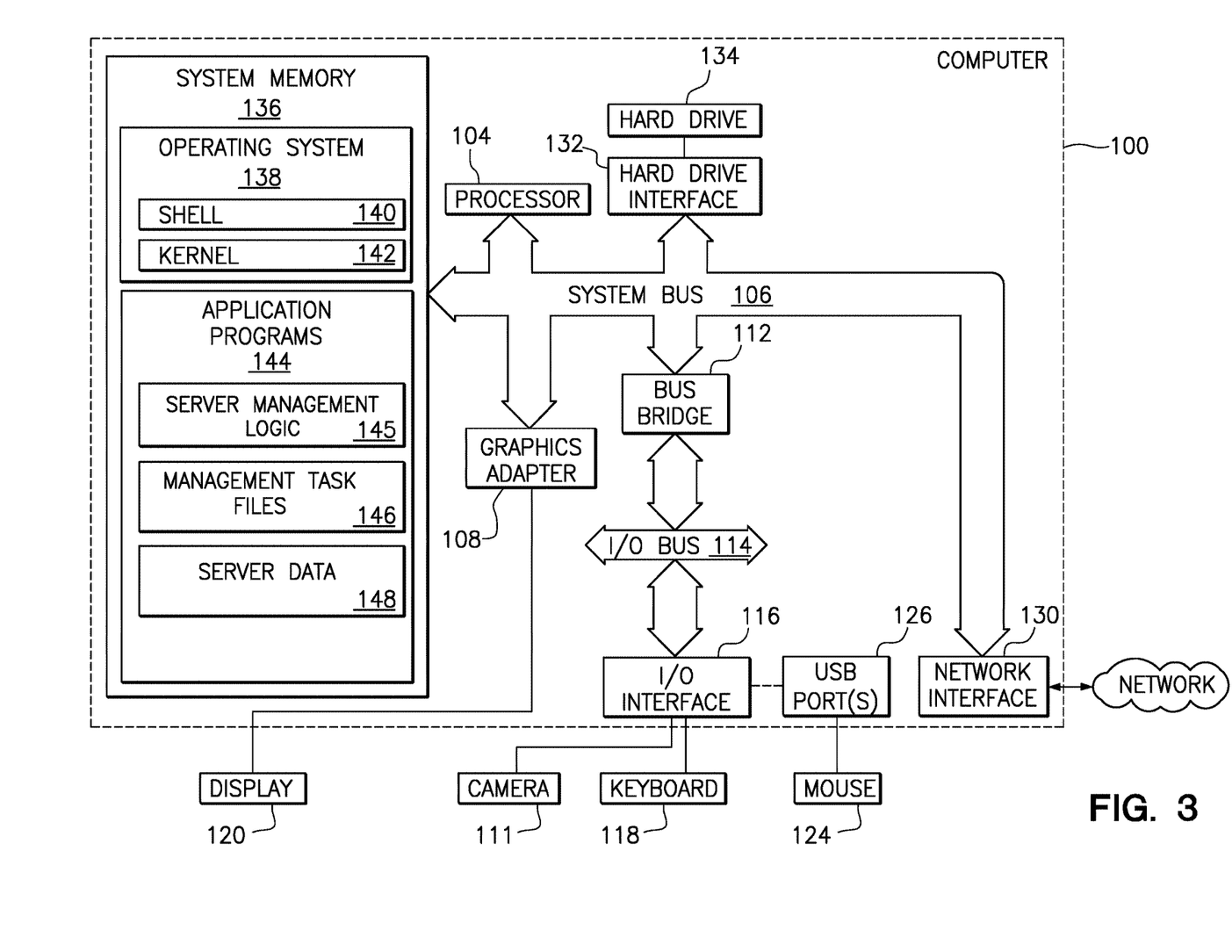
FIG. 3 is a diagram of a computer that is representative of a management computer.

FIG. 3 is a diagram of a computer that is representative of the management computer 100 of FIG. 1 according to one embodiment. Furthermore, the architecture of the computer may also be representative of the server 20 of FIGS. 1-2, without showing all of the components shown in of FIG. 2.

The computer 100 includes a processor unit 104 that is coupled to a system bus 106. The processor unit 104 may utilize one or more processors, each of which has one or more processor cores. A graphics adapter 108, which drives/supports a display 120, is also coupled to system bus 106. The graphics adapter 108 may, for example, include a graphics processing unit (GPU). The system bus 106 is coupled via a bus bridge 112 to an input/output (I/O) bus 114. An I/O interface 116 is coupled to the I/O bus 114. The I/O interface 116 affords communication with various I/O devices, including a camera 111, a keyboard 118, and a USB mouse 124 (or other type of pointing device) via USB port(s) 126. As depicted, the computer 100 is able to communicate with other network devices over a network using a network adapter or network interface controller 130. Where the computer 100 is a management computer, the network may be a management network for managing any number of servers via communication with the baseboard management controllers on those servers.

A hard drive interface 132 is also coupled to the system bus 106. The hard drive interface 132 interfaces with a hard drive 134. In a preferred embodiment, the hard drive 134 communicates with system memory 136, which is also coupled to the system bus 106. System memory is defined as a lowest level of volatile memory in the computer 100. This volatile memory includes additional higher levels of volatile memory (not shown), including, but not limited to, cache memory, registers and buffers. Data that populates the system memory 136 includes the operating system (OS) 138 and application programs 144.

The operating system 138 includes a shell 140 for providing transparent user access to resources such as application programs 144. Generally, the shell 140 is a program that provides an interpreter and an interface between the user and the operating system. More specifically, the shell 140 executes commands that are entered into a command line user interface or from a file. Thus, the shell 140, also called a command processor, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 142) for processing. Note that while the shell 140 may be a text-based, line-oriented user interface, the present invention may support other user interface modes, such as graphical, voice, gestural, etc.

As depicted, the operating system 138 also includes the kernel 142, which includes lower levels of functionality for the operating system 138, including providing services required by other parts of the operating system 138 and application programs 144. Such services may include memory management, process and task management, disk management, and mouse and keyboard management.

As shown, the computer 100 includes application programs 144 stored in the system memory of the computer 100, including, for example, server management logic 145, management task files 146 and server data 148. For example, the server management logic 145 may receive management data and management instructions from the various servers and may send configuration setting and files to the various servers. The management task files 146 may include applications, firmware and control settings for various management tasks that need to be performed for a particular server. The server data 148 may include identifying information about each server, such as a server name, server location (rack and position within the rack), and network address, to facilitate communication and management of each server.

The hardware elements depicted in the computer 100 are not intended to be exhaustive, but rather are representative. For instance, the computer 100 may include alternate memory storage devices such as magnetic cassettes, digital versatile disks (DVDs), Bernoulli cartridges, and the like. These and other variations are intended to be within the scope of the present invention.

Figure 4:
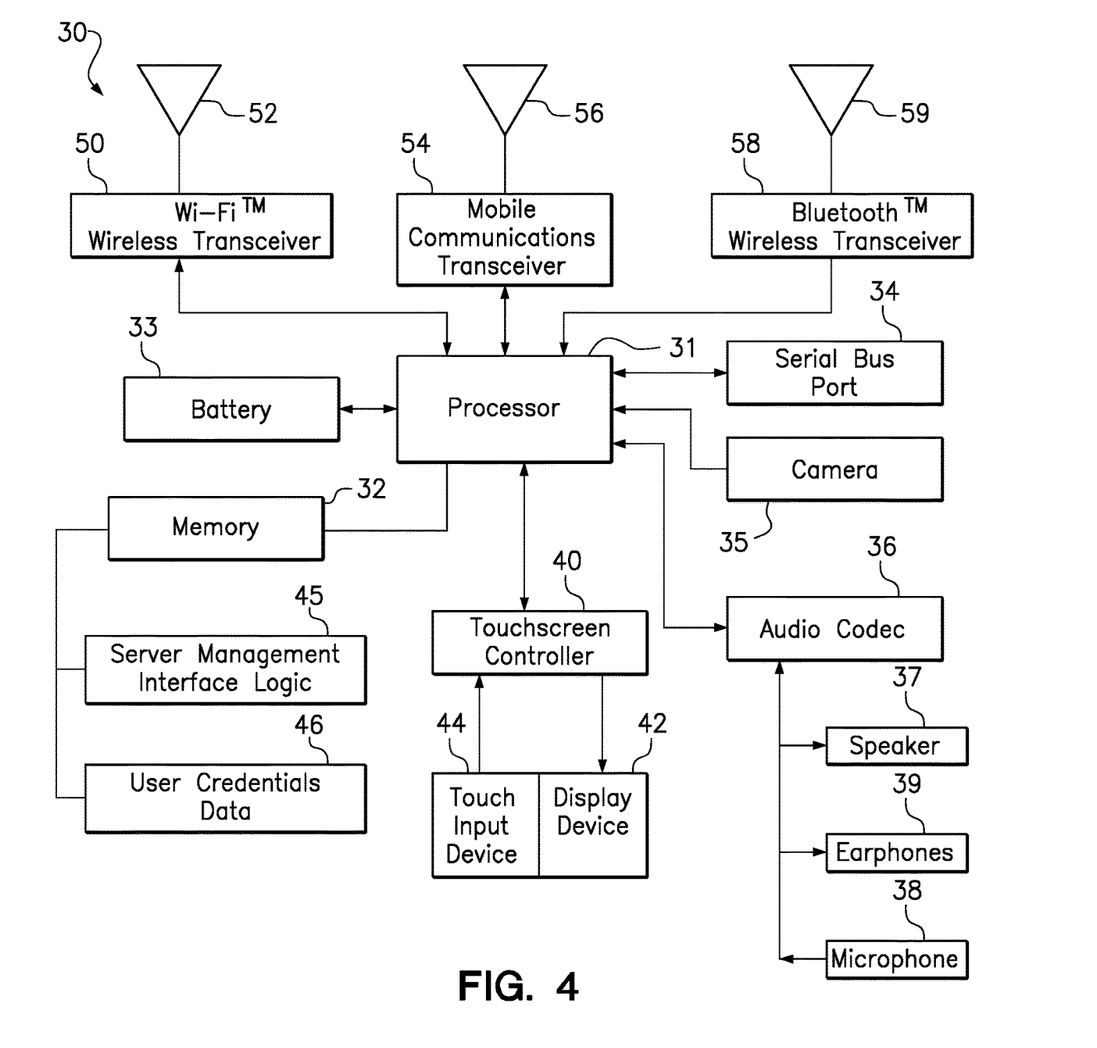
FIG. 4 is a diagram of a mobile computing device in the form of a smartphone.

FIG. 4 is a diagram of a mobile computing device in the form of a smartphone 30 capable of implementing various disclosed embodiments. The smartphone 30 may include a processor 31, memory 32, a battery 33, a serial bus port 34 (such as a USB port), a camera 35, and an audio codec 36 coupled to a built-in speaker 37, a microphone 38, and an earphone jack 39. The smartphone 10 may further include a touchscreen controller 40 which provides a graphical output to the display device 42 and an input from a touch input device 44. Collectively, the display device 42 and touch input device 44 may be referred to as a touchscreen. The touchscreen may be in either a locked condition or an unlocked condition. The touchscreen is fully functional in the unlocked condition, but, when the touchscreen is in the locked condition, the touch input device 44 will ignore all attempted input other than a specific unlocking gesture.

The smartphone 30 may also include a Wi-Fi™ wireless transceiver 50 and corresponding antenna 52, a cellular communications transceiver 54 and corresponding antenna 56, and a Bluetooth™ wireless transceiver 58 and corresponding antenna 59. Accordingly, the Bluetooth™ wireless transceiver 58 may, for example, enable communication between the smartphone 30 and the mobile communication device 18 (See FIG. 1). Similarly, the cellular communications transceiver 54 may be used to enable communication between the smartphone 30 and other communication devices 12, and the Wi-Fi™ wireless transceiver 50 may be used to enable communication with the web server 14.

In accordance with one or more embodiments, the memory 32 may include server management interface logic 45 and user credentials data 46. For example, the server management interface logic 45 may be used to send management instructions to either to the server via the serial bus port 34. The user credentials data 46 may store the user's credentials to avoid repeated re-entry and facilitate authentication with the management computer and any server to which the mobile computing device 30 is connected.

A mobile application, such as the server management interface logic 45, running on the mobile computing device 30 may communicate with the BMC of a server over the external panel serial bus port in the same manner as if the application was communicating with the BMC via the management network. For example, the application may use a REST (representational state transfer) interface of the BMC, where the application is required to authenticate itself. If the BMC supports REST requests from the application, the BMC may respond according to the privileges associated with the mobile application user who is making the requests. All of the REST APIs (application programming interfaces) that are available via the external management network may also be available to the mobile application via the wired serial bus port interface.

The mobile application that runs on the mobile computing device may have a virtual LCD mode that merely allows access to data from the BMC that was formerly available on dedicated LCD operator panels of previous servers. However, the server may now provide access to the same data through the mobile application and avoid the expense and form factor requirements of an LCD operator panel. Using the virtual LCD mode of the mobile application, a user may access similar details on the mobile computing device from the server merely by being present to plug a cable into the serial bus port without the need to login and authenticate. The available data may be provided to the mobile application using the REST interface via the external panel serial bus port. This unauthenticated REST interface may use a special network port, for example port 4999, which is firewalled off from the external management network interface and the internal Ethernet over USB network interface. The BMC will preferably support only a single REST URL (uniform resource locator), such as https://169.254.xxx.xxx:4999/virtual-lcd, which is accessible only through the external panel serial bus port and only supports the GET operation. The URL is preferably not accessible from the external management network or from the internal Ethernet over USB interface. The URL preferably does not require authentication and the GET operation may return the same data that is provide by SLP (service location protocol) attributes plus information detailing the currently active events.

Figure 5:
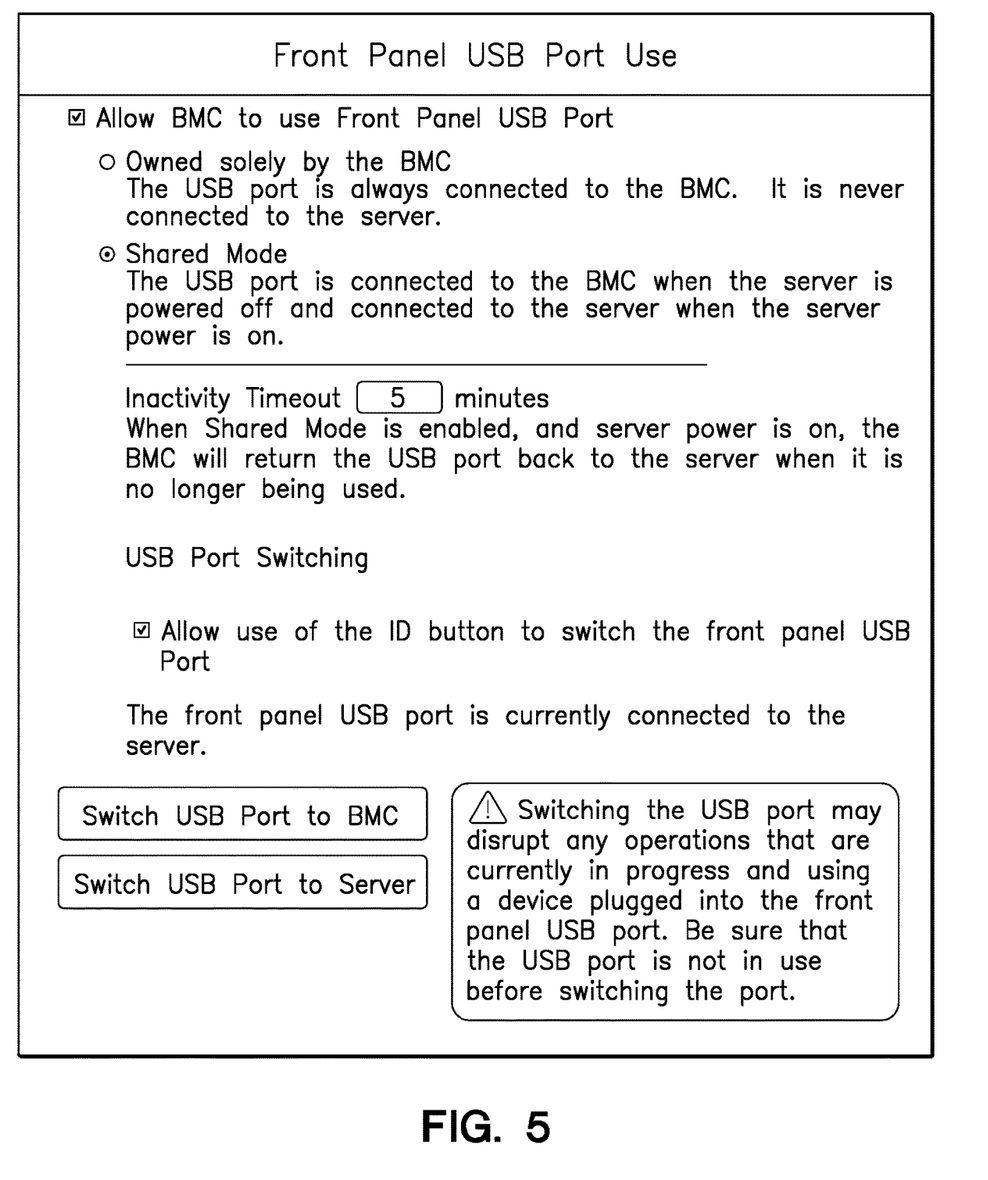
FIG. 5 is an illustration of an interface for configuring how the serial bus port is to be controlled by the baseboard management controller.

FIG. 5 is an illustration of an interface for configuring how the USB port 25 is to be controlled by the baseboard management controller 21 per FIG. 1. The illustrated interface screen is titled "External panel USB Port Use". The illustrated interface screen includes a checkbox that lets the user enable a setting which, if checked, will allow the BMC to using the external panel USB port. If the user does not enable USB access, then the BMC is not allowed to access the USB port even if the server power is turned off. Accordingly, if the BMC is not permitted to use the USB port, then the remaining configuration settings of the illustrated interface are disabled or hidden, the external panel USB port is always connected to the server (never to the BMC), and the external panel ID button activation has no effect on the USB port switching.

If the user has enabled the setting that allows the BMC access to the external panel USB port, then the user may configure the BMC to control use of the external panel USB port according to either a first mode ("owned solely by the BMC") or a second mode ("shared mode"). If the BMC is configured to have sole use of the USB port, the port is always connected to the BMC's USB controller, even when the server is powered on. If the USB port is owned solely by the BMC, then the remaining configuration settings are disabled or hidden and the external panel ID button activation has no effect on the USB port switching. However, if BMC is configured to control the USB port according to the Shared Mode, then the port is connected to the BMC when power is off, and the default connection is to the server when power is turned on. Still, when the server power is on, the USB port can be switched from the server to the BMC and back to the server as needed.

The BMC preferably supports an inactivity timeout that signals the BMC to automatically switch the USB port from the BMC to the server when the USB port is in shared mode, the server power is on, and there has been no USB activity to the BMC for a period of time. In the illustration, the user may input a number of minutes to use as a predetermined inactivity time period. The BMC may also support a setting that allows the user to choose whether or not to allow the ID (Locate) pushbutton to be used as a signal to cause the BMC to switch the USB port to or from the BMC.

If the external panel USB port configuration is set to Shared Mode and the USB port is currently connected to the server chipset, the BMC will support a request to switch the external panel USB port from the server chipset to the BMC. When this request is executed, the external panel USB connector will be switched immediately to the BMC. The USB port will remain connected to the BMC until there is no USB activity to the BMC for the period specified by the inactivity timeout. In this embodiment, it is the responsibility of the user to ensure that the external panel USB port is not being used by the server chipset when the switch to the BMC is requested. Preferably, a message will be displayed on the BMC webpage warning the user that switching the USB port may disrupt ongoing operations.

If the external panel USB port configuration is set to Shared Mode and the USB port is currently connected to the BMC, the BMC will support a request to switch the external panel USB port back to the server. When this request is executed, the external panel USB connector will be switched immediately to the server.

As will be appreciated by one skilled in the art, embodiments may take the form of a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Any combination of one or more computer readable storage medium(s) may be utilized. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device. Furthermore, any program instruction or code that is embodied on such computer readable storage media (including forms referred to as volatile memory) that is not a transitory signal are, for the avoidance of doubt, considered "non-transitory".

Program code embodied on a computer readable storage medium may be transmitted using any appropriate medium, including but not limited to wireless, wireline, optical fiber cable, RF, etc., or any suitable combination of the foregoing. Computer program code for carrying out various operations may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Embodiments may be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, and/or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored on computer readable storage media is not a transitory signal, such that the program instructions can direct a computer, other programmable data processing apparatus, or other devices to function in a particular manner, and such that the program instructions stored in the computer readable storage medium produce an article of manufacture.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to limit the scope of the claims. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the embodiment.

The corresponding structures, materials, acts, and equivalents of all means or steps plus function elements in the claims below are intended to include any structure, material, or act for performing the function in combination with other claimed elements as specifically claimed. Embodiments have been presented for purposes of illustration and description, but it is not intended to be exhaustive or limited to the embodiments in the form disclosed. Many modifications and variations will be apparent to those of ordinary skill in the art after reading this disclosure. The disclosed embodiments were chosen and described as non-limiting examples to enable others of ordinary skill in the art to understand these embodiments and other embodiments involving modifications suited to a particular implementation.

What is claimed is:

1. An apparatus, comprising:
   a computer server including a chipset and a baseboard management controller, wherein the chipset includes a first serial bus controller, and wherein the baseboard management controller includes a second serial bus controller;
   a serial bus port disposed along an external panel of a server enclosure that houses the computer server, wherein the serial bus port is accessible for connection with a connector of a serial communication cable;
   a switch that selectively connects the serial bus port to either the first serial bus controller or the second serial bus controller, wherein the switch is controlled by an output signal from the baseboard management controller; and
   a button in communication with an input to the baseboard management controller, wherein the baseboard management controller toggles the switch between a connection with the first serial bus controller and the second serial bus controller in response to receiving a signal from the button while the server is powered on.

2. The apparatus of claim 1, wherein the serial bus port is a Universal Serial Bus port, the first serial bus controller is a first Universal Serial Bus controller, and the second serial bus controller is a second Universal Serial Bus controller.

3. The apparatus of claim 1, wherein the button is disposed along the external panel of the server enclosure.

4. The apparatus of claim 1, wherein the baseboard management controller has a first general purpose input output pin for receiving input from the button and a second general purpose input output pin for sending the output signal to the switch.

5. The apparatus of claim 1, wherein the baseboard management controller has an output for toggling the switch in response to the baseboard management controller receiving a switch toggle command from a user interface while the server is powered on.

6. The apparatus of claim 1, wherein the baseboard management controller includes an Ethernet controller for communicating with a management computer over a management network.

7. The apparatus of claim 1, wherein the baseboard management controller includes a serial bus port for direct communication with the first serial bus controller.

8. The apparatus of claim 1, wherein the chipset includes a platform controller hub, and wherein the first serial bus controller is included in the platform controller hub.

9. The apparatus of claim 1, wherein the baseboard management controller has an output for controlling the switch to connect the serial bus port to the second serial bus controller in response to the computer server being powered off.

10. The apparatus of claim 1, wherein the baseboard management controller has an output for controlling the switch to connect the serial bus port to the first serial bus controller in response to the baseboard management controller detecting that power to the computer server has been initiated and that no mobile computing device is presently communicating with the baseboard management controller through the serial bus port.

11. The apparatus of claim 1, wherein the baseboard management controller has an output for controlling the switch to connect the serial bus port to the first serial bus controller in response to the baseboard management controller detecting an end to a communication session with a mobile computing device through the serial bus port.

12. The apparatus of claim 11, wherein the end to a communication session is detectable by a period of inactivity of the second serial bus controller exceeding a predetermined duration.

13. The apparatus of claim 1, wherein connecting the serial bus port to the second serial bus controller enables a mobile computing device to communicate with the baseboard management controller via a serial communication cable coupled between the mobile computing device and the serial bus port.

14. The apparatus of claim 13, wherein the second serial bus controller is for communicating with the mobile computing device using an Ethernet over Universal Serial Bus protocol.

15. The apparatus of claim 13, the baseboard management controller for providing server operating data to the mobile computing device and for receiving one or more server management instruction from the mobile computing device.

16. The apparatus of claim 1, wherein the baseboard management controller for providing, in response to the switch connecting the serial bus port to the first serial bus controller, a message to a management computer indicating that connecting the serial bus port to the second serial bus controller may disrupt ongoing operations.

* * * * *